(12) United States Patent
Ghanadan et al.

(10) Patent No.: US 6,392,480 B1
(45) Date of Patent: May 21, 2002

(54) ALTERNATING GAIN AND PHASE CONTROL SYSTEM AND METHOD

(75) Inventors: Reza Ghanadan, Berkeley Heights; Robert Evan Myer, Denville, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/378,009

(22) Filed: Aug. 19, 1999

(51) Int. Cl.[7] .............................. H03F 1/26; H04K 1/02
(52) U.S. Cl. .................... 330/149; 330/52; 330/151; 375/296
(58) Field of Search ................................ 330/149, 151, 330/52; 375/296

(56) References Cited

U.S. PATENT DOCUMENTS

| | | | |
|---|---|---|---|
| 5,455,537 A | * 10/1995 | Larkin et al. | 330/151 |
| 5,477,187 A | 12/1995 | Kobayashi et al. | 330/52 |
| 5,485,120 A | * 1/1996 | Anvari | 330/149 |
| 5,594,385 A | * 1/1997 | Anvari | 330/149 |
| 5,610,554 A | * 3/1997 | Anvari | 330/151 |
| 5,789,976 A | * 8/1998 | Ghannouchi et al. | 330/149 |
| 5,815,036 A | * 9/1998 | Yoshikawa et al. | 330/151 |
| 5,847,603 A | * 12/1998 | Myer | 330/151 |
| 5,929,704 A | * 7/1999 | Proctor, Jr. et al. | 330/149 |
| 5,963,091 A | * 10/1999 | Chen et al. | 330/149 |
| 5,999,048 A | * 12/1999 | Zhou | 330/151 |
| 6,163,210 A | * 12/2000 | Fukuchi | 330/151 |
| 6,211,733 B1 | * 4/2001 | Gentzler | 330/149 |

FOREIGN PATENT DOCUMENTS

GB 2 318 938 A 6/1998

* cited by examiner

Primary Examiner—Robert Pascal
Assistant Examiner—Khanh Van Nguyen
(74) Attorney, Agent, or Firm—Allen, Dyer, Doppelt, Milbrath & Gilchrist, P.A.

(57) ABSTRACT

A gain and phase control system performs a gain (or phase) adjustment based on the results of a previous gain (or phase) adjustment after an intervening phase (or gain) adjustment. A gain adjustment is based on the results of a previous gain adjustment rather than on the results of an intervening phase adjustment. A phase adjustment is based on the results of a previous phase adjustment rather than the results of an intervening gain adjustment. As such, the above-mentioned increase in error signal does not occur because a gain adjustment is based on the results of the previous gain adjustment, and a phase adjustment is based on the results of the previous phase adjustments. In accordance with another aspect of the present invention, the gain and phase control system makes a gain (or phase) adjustment in parallel with detecting the results from a previous phase (or gain) adjustment, thereby taking advantage of the delay between adjustment and detection of the resulting error signal to improve the convergence rate. For example, the gain and phase control system can perform single alternating gain and phase adjustments and make a gain (or phase) adjustment while detecting the error signal resulting from a preceding phase (or gain) adjustment. When the error signal resulting from the gain (or phase) adjustment is being detected, the gain and phase control system makes a phase (or gain) adjustment using the results detected from the preceding phase (or gain) adjustment.

11 Claims, 5 Drawing Sheets

CANCELLATION ERROR

ALTERNATING GAIN AND PHASE CONTROL SYSTEM AND METHOD

BACKGROUND OF THE INVENTION

1. Field of The Invention

This invention relates to a gain and phase control system for adjusting the relative phase and gain between combining signals, for example in a distortion reduction system.

2. Description of Related Art

Amplifiers often add undesired distortion to a signal, creating an output signal comprising distortion or nonlinear components and the signal component. The distortion includes any undesired signals added to or affecting adversely the input signal. There is therefore a need to devise techniques that can eliminate substantially or reduce significantly the distortion produced by the amplifier.

Feed-forward correction is routinely deployed in modern amplifiers to improve amplifier linearity with various input patterns. The essence of the feed-forward correction is to manipulate distortion, such as intermodulation (IMD) components, created by the amplifier so that at the final summing point, the distortion cancels out. Due to the unpredictability of input RF carrier pattern as well as the resultant distortion location, a known frequency component, i.e. a pilot signal, is injected in the main signal path with the distortion produced by the amplification process. In feed-forward amplifiers, the feed forward distortion reduction circuitry minimizes the pilot signal along with the distortion. As such, by designing the feed forward distortion reduction circuitry to detect and cancel the pilot signal, the distortion can also be removed.

Figure 1:
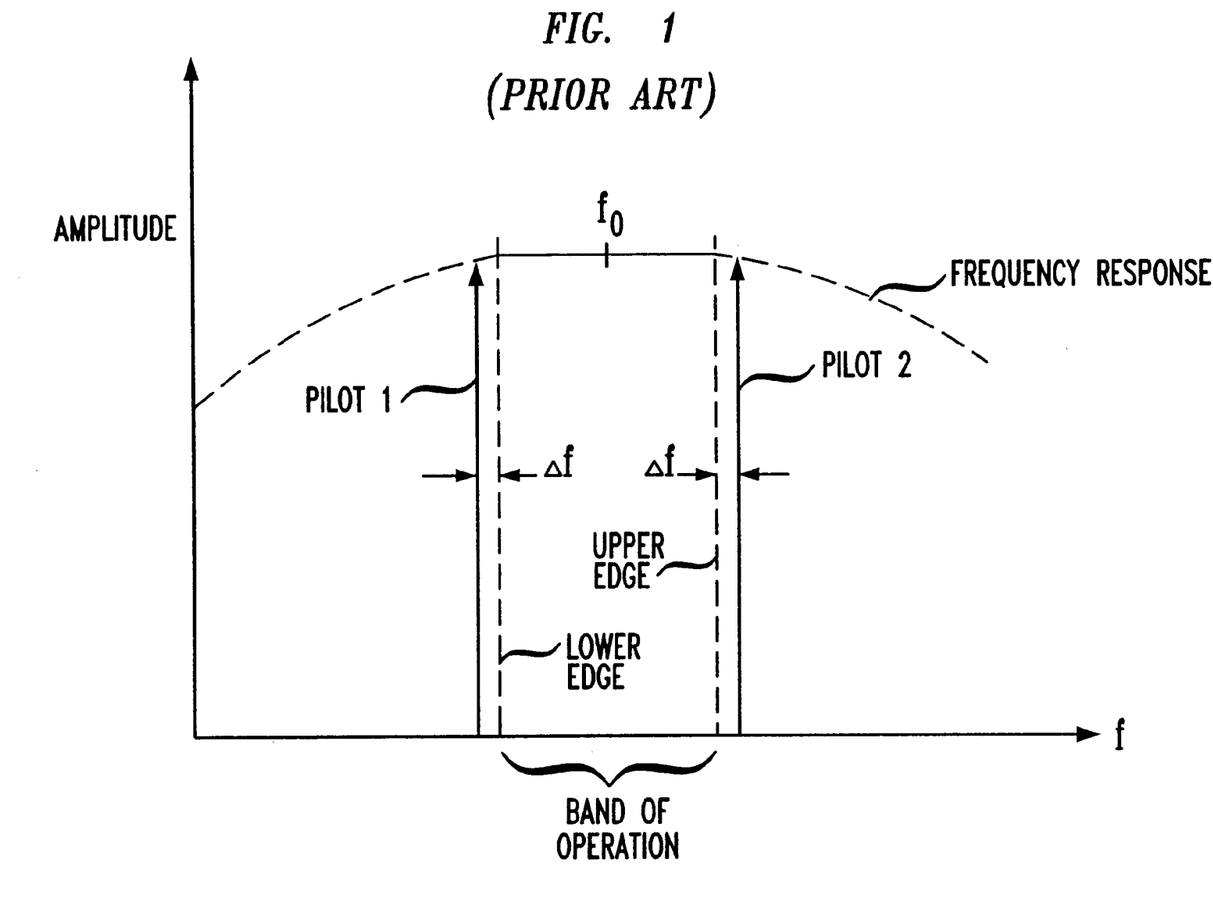
FIG. 1 shows an example frequency response curve of an RF amplifier showing the frequency within which the amplifier is operating.

The pilot signal is an electrical signal comprising at least one frequency component spectrally located near the frequency band of operation of the electrical circuit. A more complete description of the pilot signal is shown in FIG. 1 which shows the frequency response of a radio frequency (RF) amplifier including the location of the pilot signal. The pilot signal can be near the lower edge of the operating band (e.g., pilot 1) and/or located near the upper edge of the band of operation (e.g., pilot 2). The pilot is positioned a spectral distance of $\Delta f$ from an edge of the band of operation whose center frequency is $f_0$. The electrical characteristics (e.g., amplitude, phase response, spectral content) of the pilot signal are known. It should be noted that although the pilot signal is shown as having one or two spectral components of a certain amplitude, the pilot signal can comprise a plurality of spectral components having various amplitudes.

Figure 2:
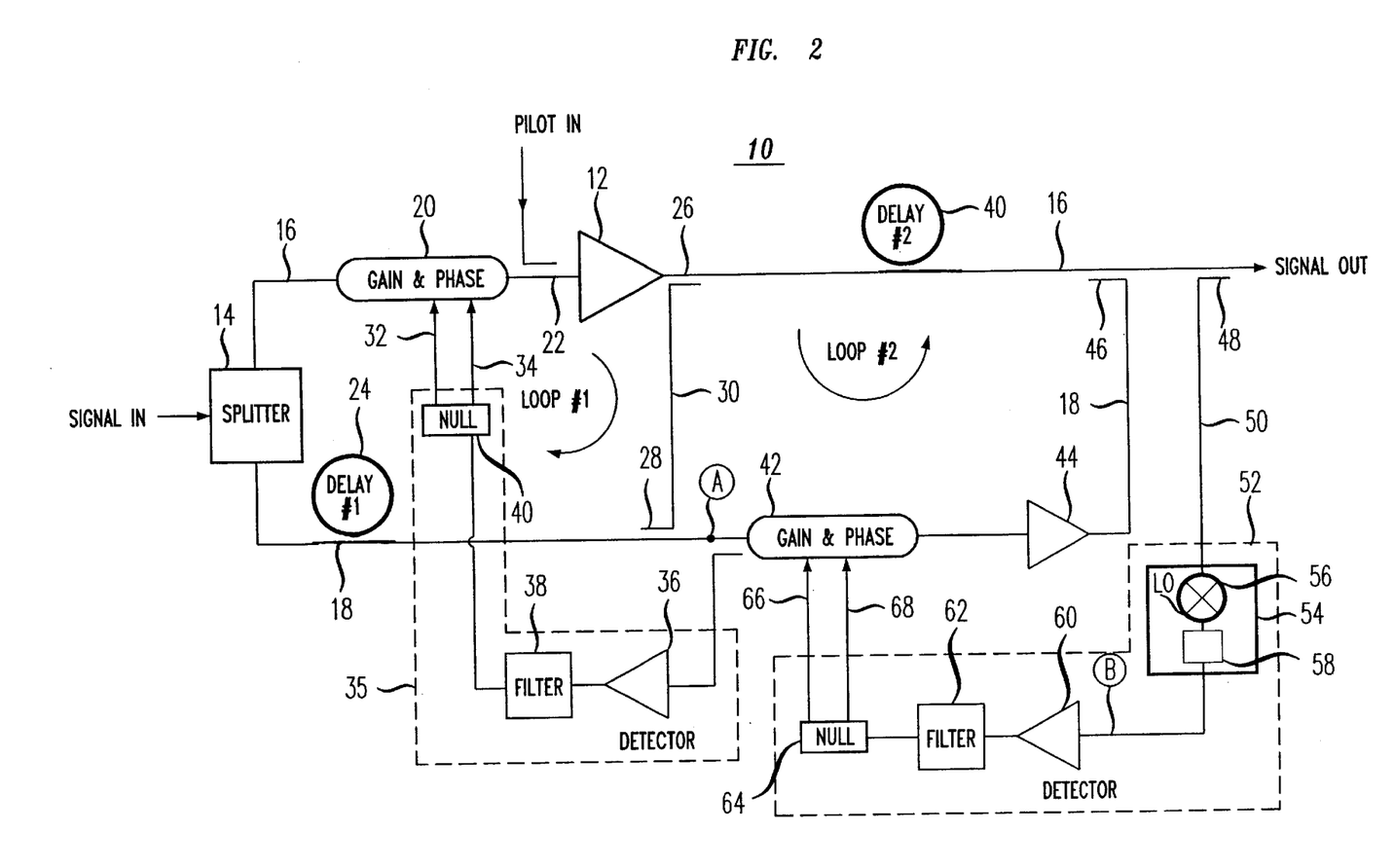
FIG. 2 is a block diagram of a feed forward distortion reduction system used for RF amplifiers.

The feed forward distortion reduction circuitry reduces distortion produced by the RF amplifier by applying the pilot signal to the RF amplifier and making adjustments based on information obtained from the applied pilot signal. FIG. 2 discloses feed-forward correction circuitry 10 and its use of information obtained from the pilot signal to reduce distortion produced by RF amplifier 12. An input signal, for example including at least one carrier signal, is applied to a splitter 14. The splitter 14 replicates the input signal on a main signal path 16 and a feed forward path 18. The splitter 14 is part of a carrier cancellation loop referred to as loop #1, which in addition to the splitter 14, comprises gain & phase circuit 20, coupler 22, the RF amplifier 12, delay circuit 24 and couplers 26 and 28. The signal on the main path 16 is applied to gain & phase circuit 20. The output of gain & phase circuit 20 and the pilot signal are applied to the coupler 22. Typically, the amplitude of the pilot signal is much less (e.g., 30 dB less) than the amplitude of the input signal so as not to interfere with the operation of the amplifier 12. The output of coupler 22 is applied to the amplifier 12 whose output comprises the amplified input signal, the amplified pilot signal and distortion signals produced by the amplifier 12.

A portion of the output of the amplifier 12 is obtained from the coupler 26 and is combined at the coupler 28 via coupling path 30 with a delayed version of the input signal on the feed forward path 18 to isolate the pilot signal with distortion on the feed forward path 18. The input signal on the feed forward path 18 is sufficiently delayed by delay circuit 24 so that such signal experiences the same delay as the signal appearing at the coupler 28 via the path 30. The resulting error signal contains the distortion produced by the amplifier 12 along with any portion of the carrier signal remaining at the output of the coupler 28 and the pilot signal. The amount of carrier cancellation in the carrier cancellation loop depends on the proper gain and phase match between the two paths from the splitter 14 to the coupler 28.

The gain & phase circuit 20 adjusts the phase and gain of the input signal according to control signals on control paths 32 and 34 such that the signal appearing at the coupler 28 via the path 30 is substantially the inverse (equal in amplitude but 180° out of phase) of the delayed input signal at the coupler 28. The gain and phase control signals appearing on the control paths 32 and 34 of the gain & phase circuit 20 are derived from the signal at the output of the coupler 28 in a well known manner using signal detection and control circuitry 35. In general, the signal detection and control circuitry 35 detects an error signal for the carrier cancellation loop. The error signal represents the amplitude of the signal at point A, and the signal detection and control circuitry 35 attempts to reduce the amplitude of the error signal by providing gain and/or phase control signals.

In this embodiment, the signal detection and control circuitry 35 includes a detector 36, such as a log detector, which produces a signal representing the amplitude of the signal at point A. A filter 38 filters the output of the log detector to produce a DC-type amplitude signal representing the amplitude of the error signal. The amplitude signal is provided to a nulling circuit 40. In response to the amplitude signal, the nulling circuit 40 provides the control signals on the control paths 32 and 34 to reduce the error signal, thereby reducing the carrier signal(s). When the error signal is minimized, the carrier signals combined at the coupler 28 substantially cancel each other leaving at the output of the coupler 28 the pilot signal with distortion produced by the amplifier 12. Loop #1 is thus a carrier cancellation loop which serves to isolate on the feed forward path 18 the pilot signal with distortion produced by the amplifier 12.

A distortion reduction loop or loop #2 attempts to reduce the pilot signal on the main signal path 16, thereby reducing the distortion produced by the amplifier 12, using the error signal at the output of the coupler 28. The pilot signal with distortion on the feed forward path 18 is fed to a gain & phase circuit 42. The output of the gain and phase circuit 42 is fed to amplifier 44 whose output is applied to coupler 46. The coupler 46 combines the amplified pilot signal and distortion on the feed forward path 18 with the signals from the amplifier 12 on the main signal path 16 (carrier signal(s), pilot signal with distortion). A delay circuit 40 on the main signal path 16 delays the signals from the output of the amplifier 12 on the main signal path 16 to experience substantially the same delay as the corresponding signals from the output of the amplifier 12 which pass over the coupling path 30 through the coupler 28 to the coupler 46.

A coupler 48 provides an error signal representative of the signal at the output of the coupler 46 onto a pilot detection path 50. Because the frequency, amplitude and other electrical characteristics of the pilot signal are known, pilot detection and control circuitry 52 can detect the amplitude of the remaining portion of the pilot signal from the error signal on the pilot detection path 50. The pilot detection and control circuitry 48 determines the amplitude of the pilot signal, and in response to the amplitude of the remaining pilot signal, the pilot detection and control circuitry 52 provides control signals to the phase and gain circuit 42. In general, the pilot detection and control circuitry 48 will detect the pilot signal and use this information to generate control signals onto paths 66 and 68 to cause the gain & phase circuit 42 to modify the pilot signal on the feed forward path 18 such that the pilot signal on the main path 16 is substantially the inverse (equal in amplitude but 180° out of phase) of the pilot signal on the feed forward path 18 at the coupler 46. The corresponding pilot signals and distortion substantially cancel each other at the coupler 46 leaving the carrier signal(s) at the output of the system. Therefore, loop #2 is a distortion reduction loop which attempts to cancel the pilot signal to cancel substantially the distortion produced by the amplifier 12.

In this embodiment, the pilot detection and control circuitry 52 includes pilot receive circuitry 54 which includes a mixer 56 to frequency convert the error signal on the pilot detection path 52 to lower frequencies and a filter 58 to facilitate detection of the pilot signal by a signal detector 60. The detector 60, such as a log detector, produces a signal representing the amplitude of the signal at point B. A filter 62 filters the output of the detector 60 to produce a DC-type amplitude signal representing the amplitude of the remaining pilot signal or error signal. The amplitude signal is provided to a nulling circuit 64. In response to the amplitude signal, the nulling circuit 64 provides control signals on the control paths 66 and 68 to the phase and gain circuit 42. The control signals are provided to reduce the amplitude signal, thereby reducing the remaining pilot signal. The amount of cancellation of the pilot signal indicates the amount of distortion cancellation. When amplitude of the pilot signal is minimized, the pilot signals and distortion combined at the coupler 46 substantially cancel each other at the output of the coupler 46.

Figure 3:
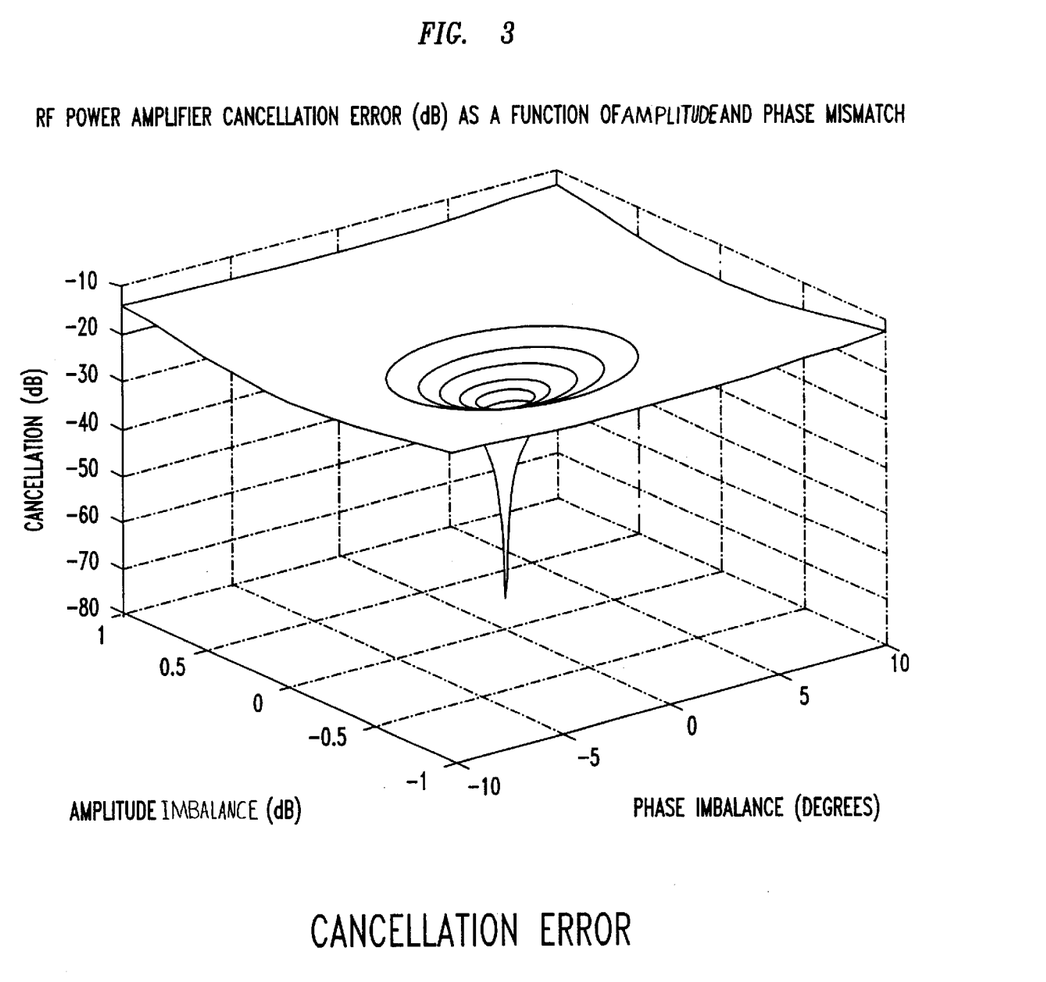
FIG. 3 shows a graph of cancellation error as a function of amplitude and phase mismatch between the combining signals.

In actual systems, however, there is rarely an absolute cancellation of the combining signals. The amount of signal cancellation depends on the proper gain and phase match between the combining signals. Signal reduction as a function of gain and phase mismatch is shown in FIG. 3. The gain and phase characteristics of the amplifiers 12 and 44 as well as of the other devices vary over time. Such variations are typically due to the temperature, input power, device age and manufacturing variations. To maintain carrier cancellation performance in the carrier cancellation loop and distortion reduction in the distortion reduction loop, the signal detection and control circuitry 35 and the pilot detection and control circuitry 52 are designed to automatically control the gain and phase characteristics for the corresponding carrier cancellation and distortion reduction loops based on the amplitudes of the corresponding error signals.

Figure 4:
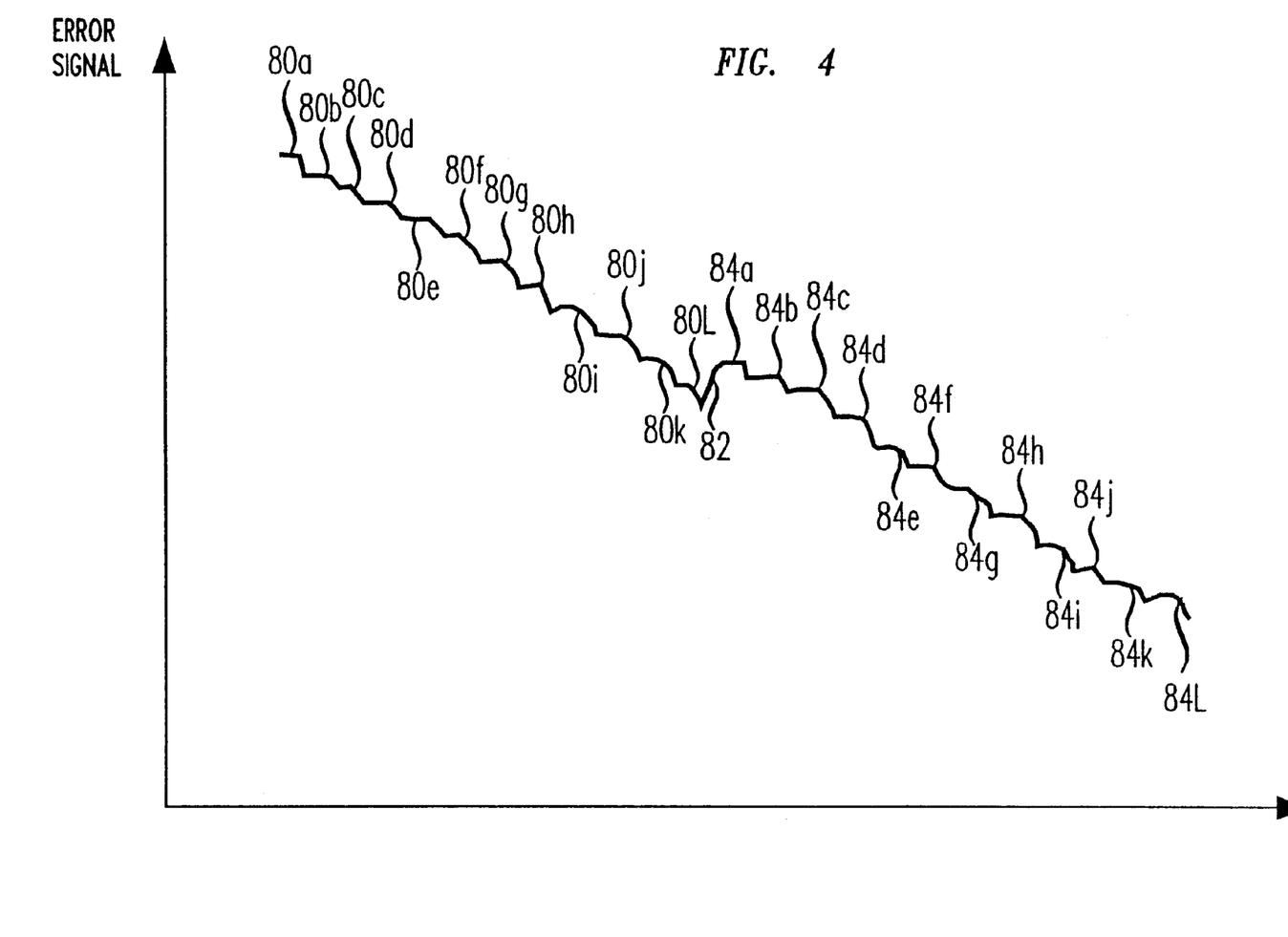
FIG. 4 shows an example graph for explaining how an error signal increase occurs between a series of gain and phase adjustments.

The nulling circuits 40 and 64 attempt to reduce the error signal (indicating improved cancellation) by comparing every error signal sample with a previous error signal sample. In this embodiment, the pilot detect and control circuitry 52 uses the pilot signal as a reference error signal. In this embodiment, each nulling circuit makes two types of adjustments (gain and phase) based on the amplitude signal from one detector 36 or 60, and the nulling circuit 40 or 64 performs a series of n steps of phase adjustments (for example 12 steps) in sequence with n steps of gain adjustments. This alternating series of gain and phase adjustments is repeatedly performed to reduce the error signal toward null. The nulling circuit 40 or 64 determines how to adjust the phase or gain adjustment value (for example $V_{out}(n+1)$) based on the results of the comparison between an error signal sample resulting from the last adjustment (for example error(n)) and the previous error signal sample (for example, error(n−1)). However, because gain and phase are relatively independent of each other, an incorrect gain or phase adjustment can be made after a series of n phase or gain adjustments. For example, as shown in FIG. 4, the magnitude of the error signal decreases after a 12 steps 80$a$–$l$ of gain adjustments, and the nulling circuit makes a phase adjustment $V_{phase}(n+1)$ based on the previous error signal samples after steps 80$k$ and 80$l$ resulting from gain adjustments (for example, error$_{gain}$(n)−error$_{gain}$(n−1). About half the time, the nulling circuit will make an incorrect phase adjustment based on the results of the last two gain adjustments, resulting in a jump 82 in the error signal. After the jump 82, steps 84$a$–$l$ of phase adjustments bring the error signal back down, but the improper adjustment determination adversely effects the convergence rate.

The nulling sensitivity and the location of the null varies as system parameters and transmit power varies. For example, in multi-user wireless communications systems, such as Code division multiple access (CDMA), Time division multiple access (TDMA), Global System for Mobile Communications (GSM) and orthogonal frequency division multiplexing (OFDM), multiple voice and/or traffic channels are combined into a single or multiple carriers. A linear amplifier should be able to react rapidly to transmit power changes and bursty traffic variations within the transient response specifications in the microsecond and millisecond ranges while providing adequate error cancellation.

SUMMARY OF THE INVENTION

The present invention involves a gain and phase control system which performs a gain (or phase) adjustment based on the results of a previous gain (or phase) adjustment after an intervening phase (or gain) adjustment. A gain adjustment is based on the results of a previous gain adjustment rather than on the results of an intervening phase adjustment. A phase adjustment is based on the results of a previous phase adjustment rather than the results of an intervening gain adjustment. As such, the above-mentioned increase in error signal does not occur because a gain adjustment is based on the results of the previous gain adjustment, and a phase adjustment is based on the results of the previous phase adjustments. In accordance with another aspect of the present invention, the gain and phase control system makes a gain (or phase) adjustment in parallel with detecting the results from a previous phase (or gain) adjustment, thereby taking advantage of the delay between adjustment and detection of the resulting error signal to improve the convergence rate. For example, the gain and phase control system can perform single alternating gain and phase adjustments and make a gain (or phase) adjustment while detecting the error signal resulting from a preceding phase (or gain) adjustment. When the error signal resulting from the gain (or phase) adjustment is being detected, the gain and phase control system makes a phase (or gain) adjustment using the results detected from the preceding phase (or gain) adjustment.

BRIEF DESCRIPTION OF THE DRAWINGS

Other aspects and advantages of the present invention may become apparent upon reading the following detailed description and upon reference to the drawings in which.

DETAILED DESCRIPTION

An illustrative embodiment of an alternating gain and phase control system according to the principles of the present invention is described with reference to a feed forward distortion reduction system. In accordance with an aspect of the present invention, after making a gain (or phase) adjustment(s) followed by an intervening phase (or gain) adjustment(s), the next gain (or phase) adjustment is determined based on the results of the last gain (or phase) adjustment rather than on the result of the intervening phase (or gain) adjustment. For example, after making a gain adjustment followed by an intervening phase adjustment(s), the alternating gain and phase control system retains the results of the last gain adjustment, for example the magnitude of the resulting error signal, and determines the next gain adjustment based on the results of the last gain adjustment rather than the results of the preceding phase adjustment. If the magnitude of the error signal resulting from the last gain adjustment decreased compared to a previous error signal, then the sign of the gain adjustment remains the same as the last gain adjustment. Otherwise, if the magnitude of the error signal resulting from the last gain adjustment increased compared to the previous error signal, the sign of the gain adjustment is changed.

In accordance with another aspect of the present invention, the gain and phase control system alternates between a gain adjustment and a phase adjustment by de-coupling the performing of gain (or phase) adjustments and the detecting of the results of the preceding phase (or gain) adjustment. As such, a gain (or phase) adjustment can be performed in parallel with the detection of the results of the preceding phase (or gain) adjustment. For example, while a gain adjustment (gain output of the null circuit) is being initiated, the error signal resulting from the preceding phase adjustment is being detected and processed. While the gain-adjusted signal experiences a propagation delay as it is amplified and combined and as the resulting error signal is detected and processed, a phase adjustment is initiated. Since the gain and phase adjustments have independent effects on the error signal, single alternating gain (and phase) adjustments performed in parallel with the detections of the results of the preceding phase (and gain) adjustments makes use of propagation delay to achieve an improved convergence rate, especially when gain and phase imbalances are not symmetrically distanced from the null. The propagation delay results from the delay experienced by the gain-or phase-adjusted signal in being amplified and combined and from the resulting error signal being detected and processed.

Figure 5:
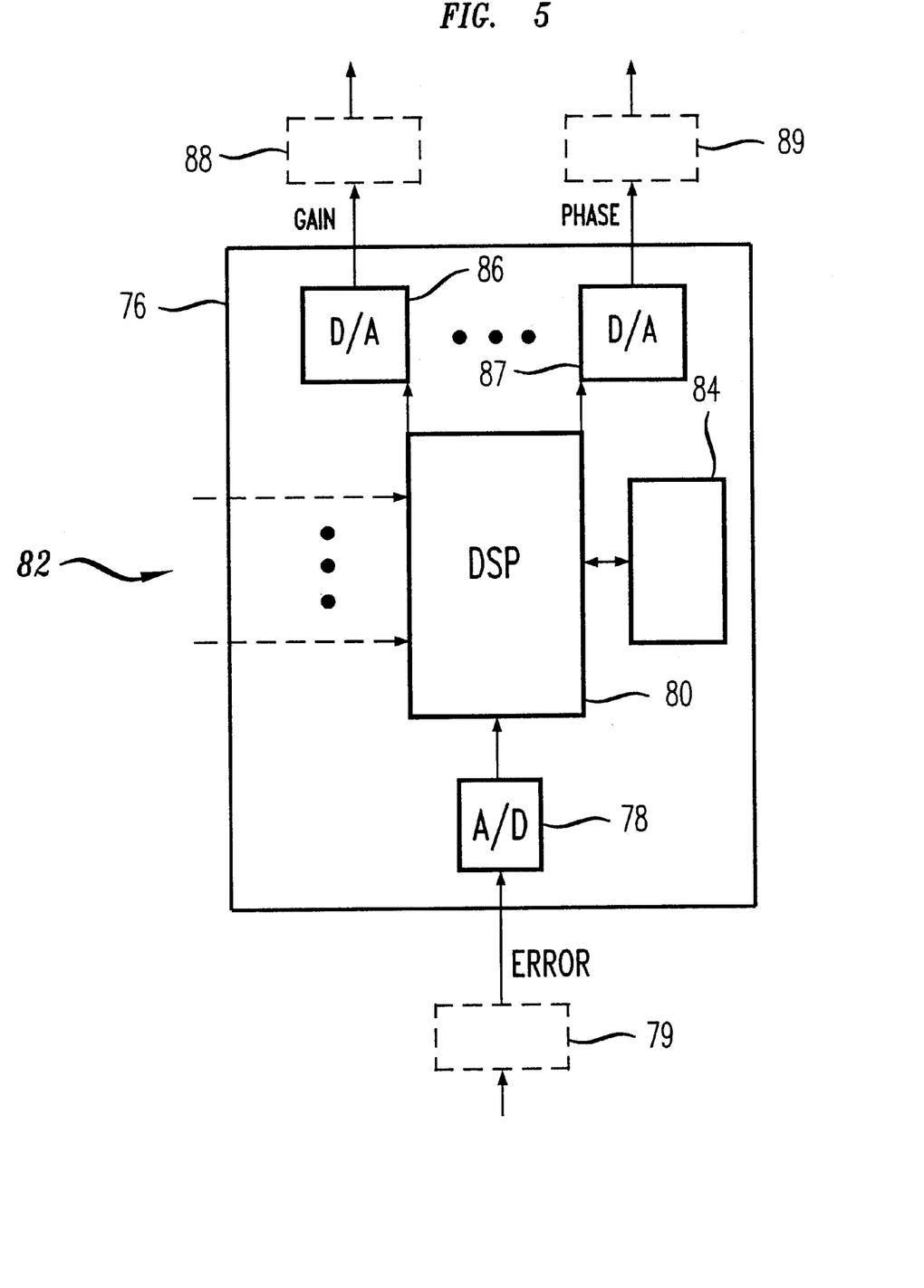
FIG. 5 shows a block diagram of an alternating gain and phase control system according to the principles of the present invention.

FIG. 5 shows a general block diagram of an alternating gain and phase control circuitry 76 which receives an error signal representing the cancellation error for combining signals. The alternating gain and phase adjustment circuitry 76 reduces the error signal by providing the gain and phase adjustment control signals to make relative gain and phase adjustments between combining signals to improve the error cancellation of the combining signals. Depending on the embodiment, the alternating gain and phase adjustment system 76 can replace the nulling circuit 40 or 64 in the feed forward arrangement 10 (FIG. 2). To improve the convergence rate, the alternating phase and gain adjustment circuitry 76 makes a previous gain (or phase) adjustment(s) followed by an intervening phase (or gain) adjustment(s), and the alternating gain and phase adjustment control 76 retains the results of the previous gain (or phase) adjustment, for example a magnitude for the resulting error signal, and determines the next gain (or phase) adjustment using the results of the previous gain (or phase) adjustment rather than the results of the intervening phase (or gain) adjustment. If the magnitude of the error signal error(n) resulting from the last gain (or phase) adjustment decreased compared to the previous error signal error(n−1) which, depending on the embodiment, resulted from either a gain or phase adjustment, then the sign of the gain (or phase) adjustment change $\Delta V(n+1)$ remains the same as the last gain (or phase) adjustment change $\Delta V(n)$. Otherwise, if the magnitude of the error signal error(n) resulting from the last gain (or phase) adjustment change $\Delta V(n)$ increased compared to the previous error signal error(n−1), the sign of the gain adjustment change $\Delta V(n+1)$ is changed.

To further improve the convergence rate, the alternating gain and phase control system 76 can make single alternating gain and phase adjustments, and a gain (or phase) adjustment can be performed in parallel with the detection of the results of the preceding phase (or gain) adjustment. Because the gain and phase adjustments have independent effects on the error signal, the alternating gain and phase control system 76 can take advantage of the propagation delay experienced by the gain- or phase-adjusted signal as the signal is amplified and combined and as the resulting error signal is detected, filtered and processed. As such, rather than making a gain (or phase) adjustment and waiting until the results of the gain or phase adjustment are detected and processed before making another gain or phase adjustment, a gain (or phase) adjustment can be performed in parallel with the detection of the results of the preceding phase (or gain) adjustment. Accordingly, in certain embodiments, the alternating gain and phase adjustment system makes a gain (or phase) adjustment while detecting the results of the preceding phase (or gain) adjustment. While the results from the gain (or phase) adjustment are being detected, a phase (or gain) adjustment is made based on the results of the previous phase (or gain) adjustment.

Other embodiments are possible which use alternating series of multiple gain and phase adjustments, alternating single and/or multiple gain and phase adjustments and different or changing numbers of alternating gain and phase adjustment(s). In embodiments with a series of multiple gain or phase adjustments, the next gain (or phase) adjustment after an intervening series of phase (or gain) adjustments is based on the results of the last gain (or phase) adjustment before the series of phase (or gain) adjustments or before a single intervening gain (or phase) adjustment. Additionally, embodiments can use previous system parameters, such as previous error signals or an error history for gain and/or phase adjustments, to make gain or phase adjustments.

In the embodiment of FIG. 5, the error signal is analog-to-digitally converted by analog to digital (A/D) converter 78. Depending on the embodiment, an anti-aliasing filter 79 can be used to remove frequencies greater than ½ the A/D sampling frequency to improve detection of the signal representing the amplitude of the error signal. A DSP 80 receives the error signal and/or additional system information 82. In response to the error signal and/or other system information 82, the DSP 80 provides a gain or phase adjustment control signals attempting to reduce the error signal. The DSP 80 can use previous or cumulative information, such as error signal history, which can be stored in memory or storage 84 to determine a step size or adjustment factor as described in co-pending application Ser. No. 09/377,387 filed concurrently with this application, assigned to the same assignee and entitled "Adaptive Gain and/or Phase Adjustment Control System and Method." The storage 84 can be integrated on the DSP 80 or electrically coupled thereto. In this embodiment, the DSP 80 produces the gain and phase adjustment signals in digital form. A digital to analog (D/A) converter 86 converts the gain adjustment signals to analog form for a gain adjuster (not shown), and a digital to analog (D/A) converter 87 converts the phase adjustment signals to analog form for a phase adjuster (not shown). Reconstruction filters 88 and 89 can be used to respectively remove high frequency components from the output of the D/A's 86 and 87. The DSP 80 can also perform other control and calculations and provide additional gain and/or phase control signals (not shown) in response to a different error signal. For example, the DSP 80 can be used to provide gain and/or phase control signals 32, 34, 66 and/or 68 (FIG. 2) in response to the corresponding error signals at the input to the detection circuitry 35 and on the path 50. In other embodiments, the alternating gain and phase adjustment control circuitry 76 can be implemented using discrete component(s), an integrated circuit(s) and/or software-driven processing circuitry.

In one embodiment, the gain and phase control circuitry 76 can determine a gain adjustment value $V_{gain}(n+1)$ by using the equation $\Delta V_{gain}(n+1)=-K_{gain}(n)*|\text{error}_{gain}(n)|*\text{sign}(\text{error}_{gain}(n)-\text{error}_{phase}(n-1))*\text{sign}(\Delta V_{gain}(n))$, where $K_{gain}(n)$ is the step size or adjustment factor for gain adjustments, $\text{error}_{gain}(n)$ is the results of the last gain adjustment, $\text{error}_{phase}(n-1)$ is the resulting error signal from the adjustment before the last gain adjustment which in this embodiment is a phase adjustment and $\Delta V_{gain}(n)$ is the adjustment change of the last gain adjustment. If the sign of $\text{error}_{gain}(n)-\text{error}_{phase}(n-1)$ is positive (meaning the last gain adjustment change $\Delta V_{gain}(n)$ resulted in an increase in the error signal), then the negative sign in front of the equation flips the sign of the adjustment change $\Delta V_{gain}(n+1)$ as compared to the sign of the previous gain adjustment change $\Delta V_{gain}(n)$. If the sign of $\text{error}_{gain}(n)-\text{error}_{phase}(n-1)$ is negative (meaning an improvement in the error signal from the last gain adjustment), the negative sign in front of the equation maintains the sign of the previous gain adjustment $\Delta V_{gain}(n)$ which resulted in the improvement.

In similar fashion, to determine the phase adjustment value, the gain and phase control circuitry 76 can determine a phase adjustment value $V_{phase}(n+1)$ by using the equation $\Delta V_{phase}(n+1)=-K_{phase}(n)*|\text{error}_{phase}(n)|*\text{sign}(\text{error}_{phase}(n)-\text{error}_{gain}(n-1))*\text{sign}(\Delta V_{phase}(n))$, where $K_{phase}(n)$ is the step size or adjustment factor for phase adjustments, $\text{error}_{phase}(n)$ is the results of the last phase adjustment, $\text{error}_{gain}(n-1)$ is the error signal resulting from the adjustment before the last phase adjustment which in this embodiment is a gain adjustment and $\Delta V_{phase}(n)$ is the adjustment change of the last phase adjustment. In some embodiments, $K_{phase}(n)$ is the same as $K_{gain}(n)$. If the sign of $\text{error}_{phase}(n)-\text{error}_{gain}(n-1)$ is positive (meaning the last phase adjustment change $\Delta V_{phase}(n)$ resulted in an increase in the error signal), then the negative sign in front of the equation flips the sign of the adjustment change $\Delta V_{phase}(n+1)$ as compared to the sign of the previous phase adjustment change $\Delta V_{phase}(n)$. If the sign of $\text{error}_{phase}(n)-\text{error}_{gain}(n-1)$ is negative (meaning an improvement in the error signal from the last phase adjustment), the negative sign in front of the equation maintains the sign of the previous phase adjustment $\Delta V_{phase}(n)$ which resulted in the improvement.

Depending on the embodiment, the gain (or phase) adjustment value $V_{out}(n+1)$ can be calculated by changing the previous gain (or phase) adjustment value $V_{out}(n)$ with a gain (or phase) adjustment change $\Delta V_{out}(n+1)$. For example, the gain adjustment value $V_{gain}(n+1)$ can be equal to $V_{gain}(n)+\Delta V_{gain}(n+1)$, where $V_{gain}(n)$ is the previous gain adjustment value and $\Delta V_{gain}(n+1)$ is the gain adjustment change. The previous adjustment value $V_{gain}(n)$ can be a fixed amount, an accumulation of adjustment changes or begins with a fixed amount which is changed by adjustment change (s). Alternatively, the adjustment value $V_{out}(n+1)$ can be calculated each time without using the magnitude of the previous adjustment value $V_{out}(n)$.

In some embodiments, the magnitude of the step-size or adjustment factor $K(n+1)$ can be the magnitude of the adjustment change $\Delta V_{out}(n+1)$ or the magnitude of the adjustment value $V_{out}(n+1)$. Depending on the embodiment, the adjustment value or change for phase and/or gain can be calculated using a fixed step size $K(n+1)$ or an adaptive adjustment factor $K(n+1)$. An adaptive step-size or adjustment factor is described in co-pending application Ser. No. 09/377,387 filed concurrently with this application, assigned to the same assignee and entitled "Adaptive Gain and/or Phase Adjustment Control System and Method", herein incorporated by reference, in which an adaptive adjustment factor $K(n+1)$ is calculated, for example using the equation:

$$K(n+1)=K_s*[a^m*\text{error}(n)+a^{m-1}*\text{error}(n-1)+\ldots+a^0*\text{error}(n-m)],$$

where $K_s$ is a normalization and scaling factor used to match the input and output voltages of the control circuitry 76 to the ranges of the gain and/or phase adjustment circuitry (not shown), "a" represents a selected value (for example, 2), n represents the current sample number for an error signal based on previous gain adjustments and/or previous phase adjustments, and m represents the number of previous error signals used to determine the weighted average. $K_s$ can be determined from the following equation:

$$K_s = \frac{\text{gain}}{\sum_{i=0}^{m} a^i},$$

where the gain is set for the minimum available adjustment value which can be accurately converted by a D/A 86 or 87.

Thus, embodiments of the alternating gain and phase control system improve the convergence rate by making a gain (or phase) adjustment using the results of the last gain (or phase) adjustment before an intervening phase (or gain) adjustment. To further improve the convergence rate, the alternating gain and phase control system can perform single alternating gain and phase adjustments whereby a phase (or gain) adjustment is performed in parallel with the detection of the results of the previous gain (or phase) adjustment. By alternating the single gain and phase adjustments and performing the adjustment and detection in parallel, the alternating gain and phase control system can further improve the convergence rate. Depending on the embodiment, the gain or phase adjustments can be determined differently for gain and phase adjustments.

In addition to the embodiment described above, alternative configurations of the alternating gain and phase adjustment system according to the principles of the present invention are possible which omit and/or add components and/or use variations or portions of the described system. Additionally, the embodiment of the alternating gain and phase control system has been described as being used with a particular feed-forward RF amplifier arrangement, but the alternating gain and phase control system can be used to improve the combining of signals in other amplifier or electrical circuit arrangements, and the combining signals could result in a constructive combination or resulting signal rather than a cancellation or error signal. Additionally, particular embodiments are possible which determine an adjustment value, an adjustment change and/or an adjustment factor as described or in a different manner. For example, an adjustment factor may be fixed which is used to determine an adjustment change which adjusts the previous adjustment value, adjusts relative to a fixed value without reference to the last or previous adjustment value(s) or is used as the adjustment value. Furthermore, the control system has been described as determining the adjustment value using the magnitude of the error signal or an error history, but depending on the application, the adjustment value can be determined based on other information, and the adjustment value can be changed in various ways.

Depending on the application, the gain and/or phase circuitry can be positioned in different locations and/or paths within the feed forward amplifier arrangement. For example the gain and phase adjustment circuit 20 could be located on the path 18 before the coupler 28; the gain and phase adjuster 42 could be located on the path 16 after the coupler 26; or gain and/or phase adjusters could be located on both paths. The control system has been described as using a software driven processing circuitry with analog and digital conversion, but other configurations can be implemented in application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of adjusting the relative phase between combining signals, said method comprising the steps of:

changing a phase adjustment value depending on the results of a previous phase adjustment performed before an intervening gain adjustment.

2. The method of claim 1 wherein said changing including:

retaining a phase error signal value resulting from said previous phase adjustment;

retaining an error signal value resulting from an adjustment before said previous phase adjustment; and changing said phase adjustment value in response to said phase error signal value and said error signal.

3. The method of claim 2 wherein said retaining an error signal value including:

retaining said error signal value which results from a first gain adjustment before said previous phase adjustment.

4. The method of claim 3 wherein said changing including:

performing a second gain adjustment after said previous phase adjustment; and changing said phase adjustment value following said second gain adjustment depending on the results of said previous phase adjustment and the results of said first gain adjustment.

5. A method of adjusting the relative gain between combining signals, said method comprising the steps of:

changing a gain adjustment value depending on the results of a previous gain adjustment performed before an intervening phase adjustment.

6. The method of claim 5 wherein said changing including:

retaining a gain error signal value resulting from said previous gain adjustment;

retaining an error signal value resulting from an adjustment before said previous gain adjustment; and changing said gain adjustment value in response to said gain error signal value and said error signal.

7. The method of claim 6 wherein said retaining an error signal value including:

retaining said error signal value which results from a first phase adjustment before said previous gain adjustment.

8. The method of claim 7 wherein said changing including:

performing a second phase adjustment following said previous gain adjustment; and changing said gain adjustment value following said second phase adjustment depending on the results of said previous gain adjustment and the results of said first phase adjustment.

9. A method of adjusting the relative phase or gain between combining signals, said method comprising the steps of:

changing an adjustment value; and detecting a result of changing a previous adjustment value in parallel with said changing of said adjustment.

10. The method of claim 9 wherein said changing and said detecting includes:

changing a gain adjustment value as said adjustment value; and detecting said result of a phase adjustment value as said previous adjustment value in parallel with said changing of said gain adjustment value.

11. The method of claim 9 wherein said changing and said detecting includes:

changing a phase adjustment value as said adjustment value; and detecting said result of a gain adjustment value as said previous adjustment value in parallel with said changing of said phase adjustment value.

* * * * *